United States Patent
Woehl et al.

(10) Patent No.: US 10,672,924 B2
(45) Date of Patent: *Jun. 2, 2020

(54) LASER FOIL TRIM APPROACHES FOR FOIL-BASED METALLIZATION FOR SOLAR CELLS

(71) Applicants: SunPower Corporation, San Jose, CA (US); Total Marketing Services, Puteaux (FR)

(72) Inventors: Robert Woehl, San Jose, CA (US); Richard Hamilton Sewell, Los Altos, CA (US); Mohamed A. Elbandrawy, Danville, CA (US); Taeseok Kim, San Jose, CA (US); Thomas P. Pass, San Jose, CA (US); Benjamin Ian Hsia, Fremont, CA (US); David Fredric Joel Kavulak, Fremont, CA (US); Nils-Peter Harder, San Jose, CA (US)

(73) Assignees: SunPower Corporation, San Jose, CA (US); Total Marketing Services, Puteaux (FR)

( * ) Notice: Subject to any disclaimer, the term of this patent is extended or adjusted under 35 U.S.C. 154(b) by 0 days.

This patent is subject to a terminal disclaimer.

(21) Appl. No.: 16/238,273

(22) Filed: Jan. 2, 2019

(65) Prior Publication Data
US 2019/0140116 A1 May 9, 2019

Related U.S. Application Data

(63) Continuation of application No. 15/453,612, filed on Mar. 8, 2017, now Pat. No. 10,177,260, which is a
(Continued)

(51) Int. Cl.
*H01L 31/0224* (2006.01)
*H01L 31/05* (2014.01)
*H01L 31/18* (2006.01)

(52) U.S. Cl.
CPC .......... *H01L 31/022433* (2013.01); *H01L 31/022441* (2013.01); *H01L 31/0516* (2013.01); *H01L 31/18* (2013.01); *Y02E 10/50* (2013.01)

(58) Field of Classification Search
None
See application file for complete search history.

(56) References Cited

U.S. PATENT DOCUMENTS

| 3,993,533 A | 11/1976 | Milnes et al. |
| 4,058,418 A | 11/1977 | Lindmayer |
| (Continued) | | |

FOREIGN PATENT DOCUMENTS

| CN | 102132423 | 7/2011 |
| DE | 10020412 | 11/2001 |
| (Continued) | | |

OTHER PUBLICATIONS

Non-Final Office Action from U.S. Appl. No. 14/927,265 dated Apr. 11, 2016, 9 pgs.
(Continued)

*Primary Examiner* — Evren Seven
(74) *Attorney, Agent, or Firm* — Schwabe, Williamson & Wyatt, P.C.

(57) ABSTRACT

Laser foil trim approaches for foil-based metallization of solar cells, and the resulting solar cells, are described. For example, a method of fabricating a solar cell includes attaching a metal foil sheet to a surface of a wafer to provide a unified pairing of the metal foil sheet and the wafer, wherein the wafer has a perimeter and the metal foil sheet has a portion overhanging the perimeter. The method also includes laser scribing the metal foil sheet along the perimeter of the wafer using a laser beam that overlaps the metal foil sheet outside of the perimeter of the wafer and at the
(Continued)

same time overlaps a portion of the unified pairing of the metal foil sheet and the wafer inside the perimeter of the wafer to remove the portion of the metal foil sheet overhanging the perimeter and to provide a metal foil piece coupled to the surface of the wafer.

20 Claims, 6 Drawing Sheets

Related U.S. Application Data continuation of application No. 14/927,265, filed on Oct. 29, 2015, now Pat. No. 9,620,655.

(56) References Cited

U.S. PATENT DOCUMENTS

| | | | |
|---|---|---|---|
| 4,318,938 A | 3/1982 | Barnett et al. |
| 4,393,576 A | 7/1983 | Dahlberg |
| 4,400,577 A | 8/1983 | Spear |
| 4,433,200 A | 2/1984 | Jester et al. |
| 4,461,922 A | 7/1984 | Gay et al. |
| 4,482,780 A | 11/1984 | Mitchell |
| 4,581,103 A | 4/1986 | Levine et al. |
| 4,582,588 A | 4/1986 | Jensen et al. |
| 4,617,421 A | 10/1986 | Nath et al. |
| 4,691,076 A | 9/1987 | Levine et al. |
| 4,695,674 A | 9/1987 | Bar-on |
| 4,697,041 A | 9/1987 | Okaniwa et al. |
| 4,882,298 A | 11/1989 | Moeller et al. |
| 4,917,752 A | 4/1990 | Jensen et al. |
| 4,957,601 A | 9/1990 | Levine et al. |
| 5,091,319 A | 2/1992 | Hotchkiss et al. |
| 5,380,371 A | 1/1995 | Murakami |
| 5,951,786 A | 9/1999 | Gee et al. |
| 5,980,679 A | 11/1999 | Severin et al. |
| 6,159,832 A | 12/2000 | Mayer |
| 6,288,326 B1 | 9/2001 | Hayashi et al. |
| 6,448,155 B1 | 9/2002 | Iwasaki et al. |
| 6,635,307 B2 | 10/2003 | Huang et al. |
| 7,355,114 B2 | 4/2008 | Ojima et al. |
| 8,003,530 B2 | 8/2011 | Grohe et al. |
| 8,146,643 B2 | 4/2012 | Kasahara et al. |
| 8,809,192 B2 | 8/2014 | Bertram et al. |
| 9,040,409 B2 | 5/2015 | Kumar et al. |
| 9,257,575 B1 | 2/2016 | Pass et al. |
| 2005/0253142 A1 | 11/2005 | Negami et al. |
| 2006/0166023 A1 | 7/2006 | Yoshikata et al. |
| 2006/0276000 A1 | 12/2006 | Lim |
| 2008/0042153 A1 | 2/2008 | Beeson et al. |
| 2008/0128019 A1 | 6/2008 | Lopatin et al. |
| 2008/0216887 A1 | 9/2008 | Hacke et al. |
| 2008/0223429 A1 | 9/2008 | Everett et al. |
| 2009/0194162 A1 | 8/2009 | Sivaram et al. |
| 2009/0221112 A1 | 9/2009 | Grohe et al. |
| 2010/0032013 A1 | 2/2010 | Krause et al. |
| 2010/0200058 A1 | 8/2010 | Funakoshi |
| 2010/0243041 A1 | 9/2010 | Carlson et al. |
| 2011/0162703 A1 | 7/2011 | Adibi et al. |
| 2012/0103408 A1 | 5/2012 | Moslehi et al. |
| 2012/0237695 A1 | 9/2012 | Pye et al. |
| 2012/0240995 A1 | 9/2012 | Coakley et al. |
| 2013/0139871 A1 | 6/2013 | Hirata et al. |
| 2013/1016082 | 6/2013 | Lantzer et al. |
| 2013/0183796 A1 | 7/2013 | Stewart et al. |
| 2013/0316185 A1 | 11/2013 | Evangelista et al. |
| 2015/0004737 A1 | 1/2015 | Harley |
| 2015/0129031 A1 | 5/2015 | Moslehi et al. |
| 2015/0280021 A1 | 10/2015 | Harley et al. |
| 2015/0349154 A1 | 12/2015 | Harley et al. |
| 2016/0093757 A1 | 3/2016 | Pass et al. |
| 2016/0172516 A1 | 6/2016 | Kavulak et al. |

FOREIGN PATENT DOCUMENTS

| | | |
|---|---|---|
| EP | 1634673 | 3/2006 |
| JP | 2003/246971 | 9/2003 |
| WO | WO 1999/040760 | 8/1999 |
| WO | WO 2010/025269 | 3/2010 |

OTHER PUBLICATIONS

Final Office Action from U.S. Appl. No. 14/927,265 dated Jul. 21, 2016, 9 pgs.

Cotter, et al., "Novel Process for Simplified Buried Contact Solar Cells," Institute of Electrical and Electronics Engineers, Aug. 2000, pp. 303-306.

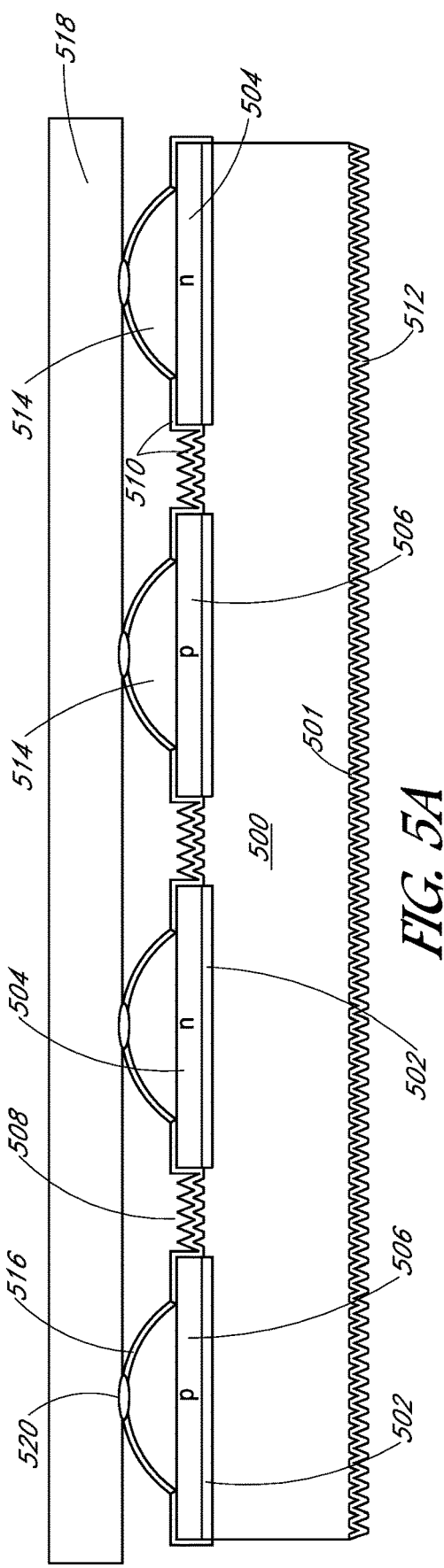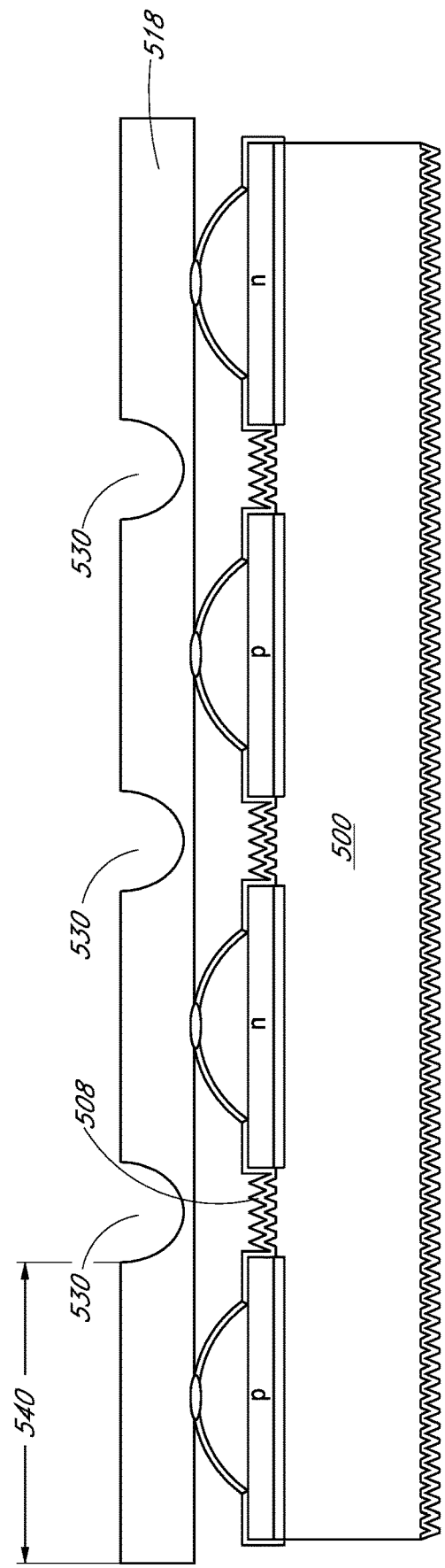

LASER FOIL TRIM APPROACHES FOR FOIL-BASED METALLIZATION FOR SOLAR CELLS

CROSS-REFERENCE TO RELATED APPLICATIONS

This application is a continuation of U.S. patent application Ser. No. 15/453,612, filed on Mar. 8, 2017, which is a continuation of U.S. patent application Ser. No. 14/927,265, filed on Oct. 29, 2015, now U.S. Pat. No. 9,620,655 issued on Apr. 11, 2017, the entire contents of which are hereby incorporated by reference herein.

TECHNICAL FIELD

Embodiments of the present disclosure are in the field of renewable energy and, in particular, include laser foil trim approaches for foil-based metallization of solar cells, and the resulting solar cells.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

BRIEF DESCRIPTION OF THE DRAWINGS

FIGS. 5A-5C illustrate cross-sectional views of various stages of further continued processing in the fabrication of a solar cell using foil-based metallization, in accordance with an embodiment of the present disclosure.

DETAILED DESCRIPTION

Figure 1:
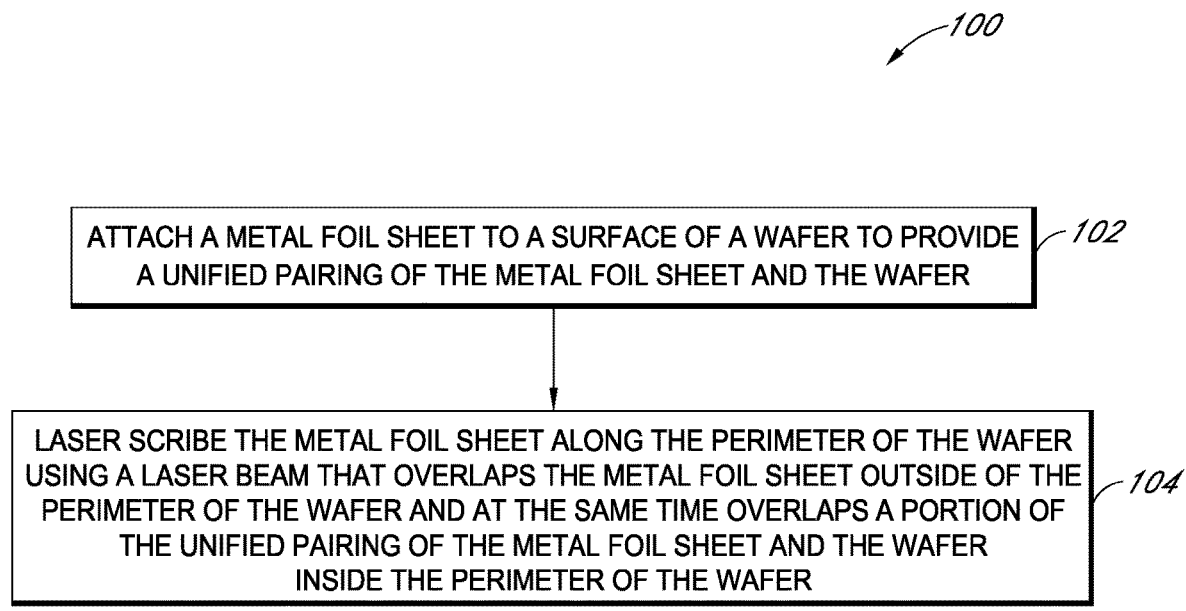
FIG. 1 is a flowchart listing operations in a method of fabricating a solar cell as corresponding to FIGS. 2A-2C, in accordance with an embodiment of the present disclosure.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

Laser foil trim approaches for foil-based metallization of solar cells, and the resulting solar cells, are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as emitter region fabrication techniques, are not described in detail in order to not unnecessarily obscure embodiments of the present disclosure. Furthermore, it is to be understood that the various embodiments shown in the figures are illustrative representations and are not necessarily drawn to scale.

Disclosed herein are methods of fabricating solar cells. In one embodiment, a method of fabricating a solar cell includes attaching a metal foil sheet to a surface of a wafer to provide a unified pairing of the metal foil sheet and the wafer, wherein the wafer has a perimeter and the metal foil sheet has a portion overhanging the perimeter. The method also includes laser scribing the metal foil sheet along the perimeter of the wafer using a laser beam that overlaps the metal foil sheet outside of the perimeter of the wafer and at the same time overlaps a portion of the unified pairing of the metal foil sheet and the wafer inside the perimeter of the wafer to remove the portion of the metal foil sheet overhanging the perimeter and to provide a metal foil piece coupled to the surface of the wafer.

In another embodiment, a method of fabricating a solar cell includes attaching a metal foil sheet to a surface of a wafer to provide a unified pairing of the metal foil sheet and the wafer, wherein the wafer has a perimeter and the metal foil sheet has a portion overhanging the perimeter. The method also includes laser scribing the metal foil sheet along the perimeter of the wafer. The laser scribing involves removing the portion of the metal foil sheet overhanging the perimeter to provide a metal foil piece coupled to the surface of the wafer. The laser scribing also involves welding a portion of the metal foil sheet to the wafer inside the perimeter of the wafer during the removing of the portion of the metal foil sheet overhanging the perimeter.

In another embodiment, a method of fabricating a solar cell includes attaching a metal foil sheet to a surface of a wafer to provide a unified pairing of the metal foil sheet and the wafer, wherein the wafer has a perimeter and the metal foil sheet has a portion overhanging the perimeter. The method also includes laser scribing the metal foil sheet along the perimeter of the wafer using a laser beam that overlaps the metal foil sheet outside of the perimeter of the wafer and at the same time overlaps a portion of the unified pairing of the metal foil sheet and the wafer inside the perimeter of the wafer to remove the portion of the metal foil sheet overhanging the perimeter and to provide a metal foil piece coupled to the surface of the wafer. The laser scribing further involves welding a portion of the metal foil sheet to the wafer inside the perimeter of the wafer during the removing of the portion of the metal foil sheet overhanging the perimeter.

One or more embodiments described herein may involve approaches for cutting or trimming an overhang portion of a metal foil (e.g., an aluminum foil) attached to a surface of a wafer of a solar cell. In an embodiment, a very wide laser spot or line of several hundred microns is used for scribing by following the edge of the wafer with the metal foil in between the wafer and the laser. With the appropriate laser and power settings, the metal foil overhang can be cut. In one such embodiment, in locations where the metal foil touches the wafer, the metal foil does not get ablated but instead welds to the wafer. In an exemplary embodiment, an outer most emitter "finger" may be about 650 microns away from the wafer edge. Accordingly, there is an approximately 650 micron region where the laser can land, so long as it overlaps with the metal foil overhang. Embodiments may include approaches for aligning the wafer to the laser. However, due to high tolerances, the wafer may need only be aligned roughly. For example, by using a wide laser that cuts the metal foil at the overhang but does not cause extensive damage where the metal foil contacts the wafer, in combination with exploiting the gap between wafer edge and outer finger of cell, the alignment only needs to be rough. The result is effectively a self-aligning technique for cutting or trimming the metal foil overhang post attaching or bonding of the metal foil to the wafer.

To provide context, cutting or trimming a metal foil (such as an aluminum metal foil) may be a necessary operation post bonding of the metal foil to the wafer since the wafer may need to be stacked in a cassette for transport. Furthermore, the subsequent patterning process of the foil traditionally involves use of a camera from the device side to detect the edge which therefore needs to be "detectable." Cutting the foil at the edge mechanically may be difficult due to the fragile wafer edge. Accordingly, attention has been focuses on cutting or trimming the metal foil by a laser process. However, issues with a standard laser process can arise even with perfect wafer positioning on a chuck, since the laser has some tolerances in the range of approximately 40 microns. As such, there is potential that some foil overhang is left behind, or the cut occurs into the wafer and does not cut the foil, depending whether the laser is outside or inside of the wafer perimeter.

Addressing one or more of the above issues, in accordance with an embodiment of the present disclosure, a metal foil is bonded to the device side of a wafer either by laser-welding (LW) or by thermocompression (TC) bonding. Both processes leave a wafer with an Al foil overhang behind. In one embodiment, a laser line (or spots that overlap and form a line) are used to cut along the wafer edge location from the foil side. In an embodiment, the laser lines are sufficiently wide to cut the foil where it overhangs the wafer, while not causing any significant damage at the wafer where the foil touches the wafer. It is to be appreciated that the less the damage to the silicon wafer, the larger the potential area where the laser hits the wafer and welds the aluminum. In an exemplary embodiment, for an outer most finger void space of about 650 microns to the edge, a laser line width may be selected up about the same distance. Selecting a line width of 600 microns, for example, and targeting the center of line at the edge, a tolerance of 300 microns to both sides would be achieved, while still trimming or cutting the foil without impacting outermost portions of the emitter fingers. In an embodiment, such essentially self-aligning processing for cutting/trimming the foil can have an additional advantage of "sealing" the edge of the metal foil to the wafer.

Figure 2A:
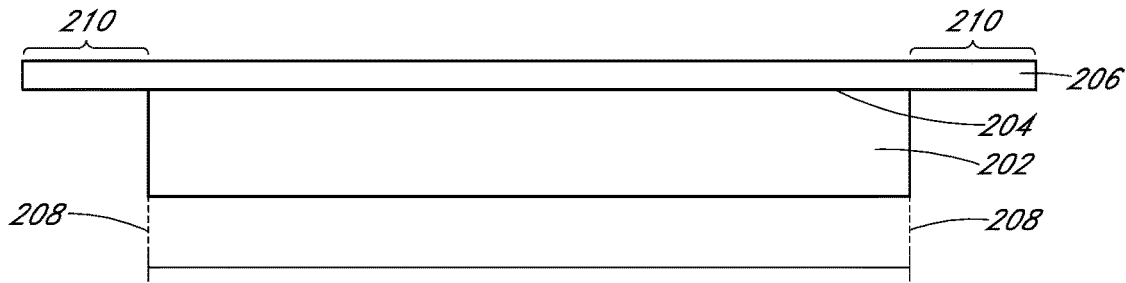
FIGS. 2A-2C illustrate cross-sectional views of various stages in the fabrication of a solar cell using foil-based metallization, in accordance with an embodiment of the present disclosure.
Figure 2B:
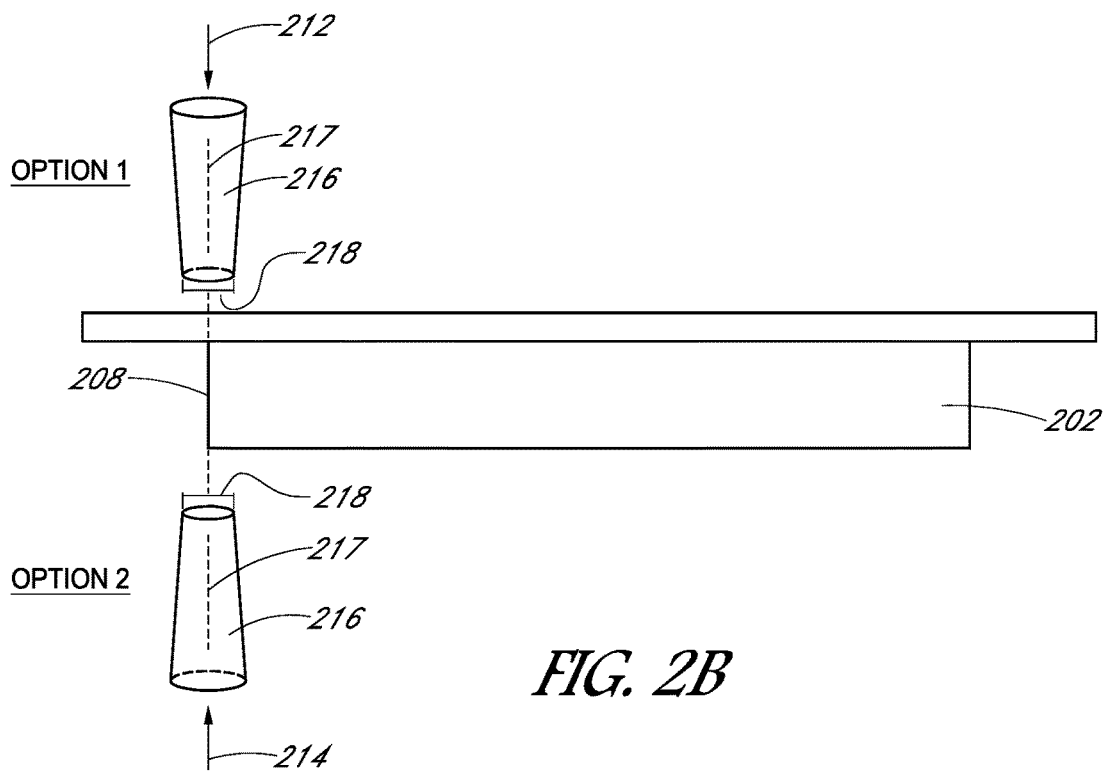
Figure 2C:
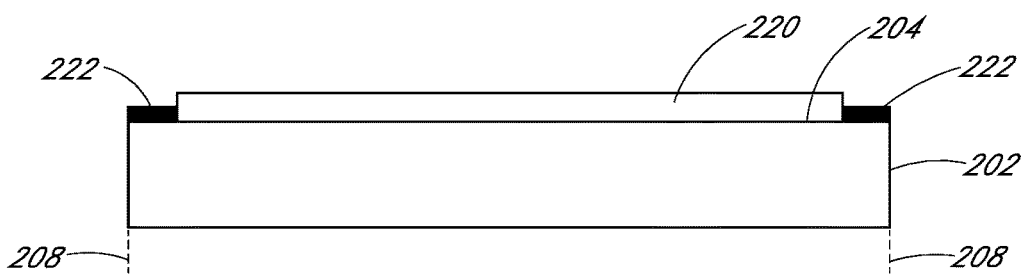

Thus a laser process may be used to trim a metal foil for a foil and solar cell pairing fabrication approach. As an example, FIGS. 2A-2C illustrate cross-sectional views of various stages in the fabrication of a solar cell using foil-based metallization, in accordance with an embodiment of the present disclosure. FIG. 1 is a flowchart listing operations in a method of fabricating a solar cell as corresponding to FIGS. 2A-2C, in accordance with an embodiment of the present disclosure.

Referring to operation 102 of flowchart 100 and corresponding FIG. 2A, a method of fabricating a solar cell includes attaching a metal foil sheet 206 to a surface 204 of a wafer 202, such as a silicon wafer, to provide a unified pairing of the metal foil sheet 206 and the wafer 202. The wafer has a perimeter 208 and the metal foil sheet 206 has a portion 210 overhanging the perimeter 208. Although only one dimension is shown in FIG. 2A, it is to be appreciated that the perimeter 208 of the wafer 202 also has a dimension into and out of the page. In an embodiment, the metal foil sheet 206 further has a portion overhanging the perimeter in the dimension into and out of the page.

In an embodiment, the metal foil sheet 206 is attached to the surface 204 of the wafer 202 by using a technique such as, but not limited to, a laser welding process, a thermo-compression process or an ultrasonic bonding process. In an embodiment, the metal foil sheet 206 is first placed over the surface 204 of the wafer 202 by adhering the metal foil sheet 206 to the surface 204 of the wafer 202 via vacuum suction. In one such embodiment, the metal foil sheet 206 has one or more holes there-through. The one or more holes are for enabling vacuum adhesion of the metal foil sheet 206 to the surface 204 of the wafer 202.

In an embodiment, attaching the metal foil sheet 206 to the surface 204 of the wafer 202 further involves locating the metal foil sheet 206 with the surface 204 of the wafer 202. In one such embodiment, pressure is applied by an applicator which provides a downward force onto the metal foil sheet 206. The applicator may be moved (while providing downward pressure) across the metal foil sheet 206 to ultimately fit-up the metal foil sheet 206 with the entire underlying solar cell. In a particular embodiment, the metal foil is located with the metalized surface of the wafer via applying pressure by using an applicator such as, but not limited to, a roller, a diamond-shaped applicator, or a squeegee. In one such embodiment, applying pressure by using the applicator involves removing air and physical gaps from between the metal foil sheet 206 and the surface 204 of the wafer 202. In an embodiment, the surface 204 of the wafer 202 is a metallized surface of the wafer 202, examples of which are described in greater detail below.

Referring to operation 104 of flowchart 100 and corresponding FIG. 2B, the method of fabricating the solar cell further includes laser scribing 212 or 214 the metal foil sheet 206 along the perimeter 208 of the wafer 202. The laser scribing 212 or 214 is performed using a laser beam 216 having a width 218. The width 218 of the laser beam 216 is suitable to overlap the metal foil sheet 206 outside of the perimeter 208 of the wafer 202 (e.g., at portion 210 of metal foil sheet 206). At the same time, the laser beam 216 overlaps a portion of the unified pairing of the metal foil sheet 206 and the wafer 202 inside the perimeter 208 of the wafer 202.

In an embodiment, the laser scribing is performed from the metal foil sheet 206 side of the unified pairing of the metal foil sheet 206 and the wafer 202, as is depicted with laser scribing process 212 (option 1). In another embodiment, the laser scribing is performed from the wafer 202 side of the unified pairing of the metal foil sheet 206 and the wafer 202, as is depicted with laser scribing process 214 (option 2). In yet another embodiment, the laser scribing is performed both from the metal foil sheet 206 side of the unified pairing of the metal foil sheet 206 and the wafer 202, as is depicted with laser scribing process 212, and from the wafer 202 side of the unified pairing of the metal foil sheet 206 and the wafer 202, as is depicted with laser scribing process 214, at substantially the same time.

In an embodiment, the laser beam 216 has a central axis 217 aligned to the perimeter 208 of the wafer 202. In one such embodiment, the laser scribing 212 or 214 is performed with the laser beam 216 having the central axis 217 aligned to the perimeter 208 of the wafer 202 by aligning using a galvanometer alignment system. In an embodiment, the laser beam 216 has a width approximately in the range of 300-600 microns. In an embodiment, laser scribing 212 or 214 the metal foil sheet 206 along the perimeter 208 of the wafer 202 using the laser beam 216 involves using a continuous laser beam process. In another embodiment, laser scribing 212 or 214 the metal foil sheet 206 along the perimeter 208 of the wafer 202 using the laser beam 216 involves using a pulsed laser beam process.

Referring again to operation 104 of flowchart 100 and now to corresponding FIG. 2C, the laser scribing 212 or 214 of FIG. 2B removes the portion 210 of the metal foil sheet 206 overhanging the perimeter 208 of the wafer 202. Upon removal of the portion 210 of the metal foil sheet 206 overhanging the perimeter 208 of the wafer 202, a metal foil piece 220 coupled to the surface 204 of the wafer 202 is provided.

Figure 3:
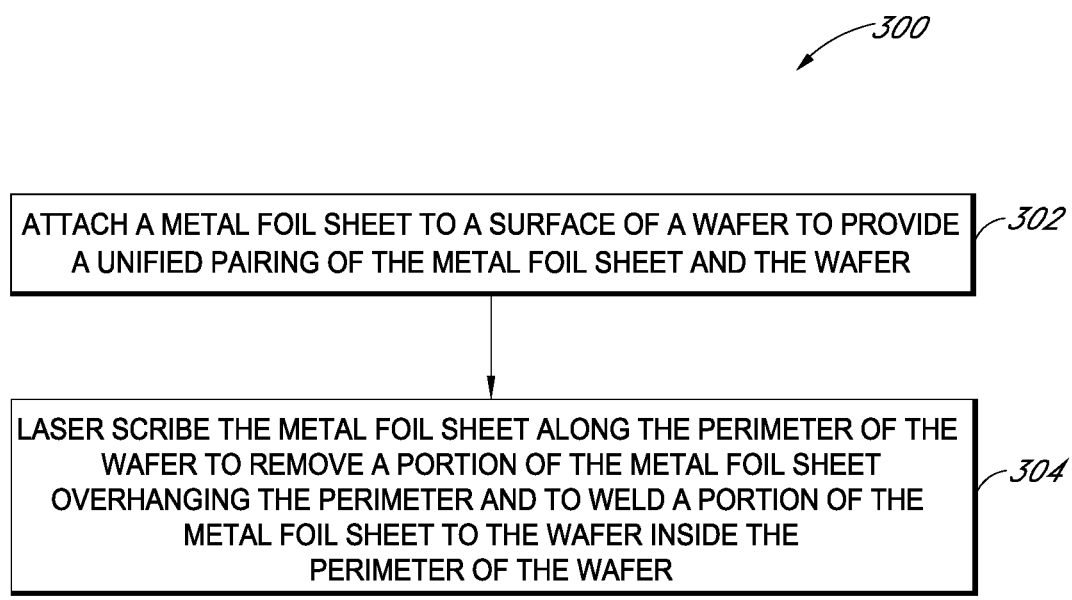
FIG. 3 is a flowchart listing operations in another method of fabricating a solar cell as corresponding to FIGS. 2A-2C, in accordance with another embodiment of the present disclosure.

In another aspect, a laser trim process may involve welding a portion of a metal foil to a wafer. For example, FIG. 3 is a flowchart listing operations in another method of fabricating a solar cell as corresponding to FIGS. 2A-2C, in accordance with another embodiment of the present disclosure.

Referring to operation 302 of flowchart 300 and corresponding FIG. 2A, a method of fabricating a solar cell includes attaching a metal foil sheet 206 to a surface 204 of a wafer 202, such as a silicon wafer, to provide a unified pairing of the metal foil sheet 206 and the wafer 202. The wafer has a perimeter 208 and the metal foil sheet 206 has a portion 210 overhanging the perimeter 208. Although only one dimension is shown in FIG. 2A, it is to be appreciated that the perimeter 208 of the wafer 202 also has a dimension into and out of the page. In an embodiment, the metal foil sheet 206 further has a portion overhanging the perimeter in the dimension into and out of the page. In an embodiment, the metal foil sheet 206 is attached to the surface 204 of the wafer 202 in a manner similar to described above for operation 102 of flowchart 100.

Referring to operation 304 of flowchart 300 and corresponding FIGS. 2B and 2C, the method of fabricating the solar cell further includes laser scribing 212 or 214 the metal foil sheet 206 along the perimeter 208 of the wafer 202. The laser scribing 212 or 214 involves removing the portion 210 of the metal foil sheet 206 overhanging the perimeter 208 to provide a metal foil piece 220 coupled to the surface 204 of the wafer 202. The laser scribing 212 or 214 also involves welding a portion 222 of the metal foil sheet 206 to the wafer 202 inside the perimeter 208 of the wafer 202 during the removing of the portion 210 of the metal foil sheet 206 overhanging the perimeter 208, as is depicted in FIG. 2C.

In an embodiment, welding the portion 222 of the metal foil sheet 206 to the wafer 202 involves using the wafer 202 as a heat sink during the laser scribing 212 or 214. It is to be appreciated that, in other embodiments, a weld need not be formed in order to utilize the wafer 202 as a heat sink. Other laser scribing parameters associated with operation 304 of flowchart 300 can be as described above with respect to operation 104 of flowchart 100.

It is to be appreciated that concepts described with respect to flowcharts 100 and 300 can be performed in a same method. For example, in an embodiment, with reference again to FIGS. 2A-2C, a method of fabricating a solar cell includes attaching a metal foil sheet 206 to a surface 204 of a wafer 202 to provide a unified pairing of the metal foil sheet 206 and the wafer 202. The wafer 202 has a perimeter 208 and the metal foil sheet 206 has a portion 210 overhanging the perimeter 208. The method also includes laser scribing 212 or 214 the metal foil sheet 206 along the perimeter 208 of the wafer 202 using a laser beam 216 that overlaps the metal foil sheet 206 outside of the perimeter 208 of the wafer 202 and at the same time overlaps a portion of the unified pairing of the metal foil sheet 206 and the wafer 202 inside the perimeter 208 of the wafer 202 to remove the portion 210 of the metal foil sheet 206 overhanging the perimeter 208. The laser scribing 212 or 214 provides a metal foil piece 220 coupled to the surface 204 of the wafer 202. The laser scribing 212 or 214 further involves welding a portion 222 of the metal foil sheet 206 to the wafer 202 inside the perimeter 208 of the wafer 202 during the removing of the portion 210 of the metal foil sheet 206 overhanging the perimeter 208.

In an embodiment, the resulting structures of FIG. 2C is subjected to an electrical contacting process. As an example, FIGS. 4A and 4B illustrate angled views of various stages of continued processing in the fabrication of a solar cell using foil-based metallization, in accordance with an embodiment of the present disclosure.

Figure 4A:
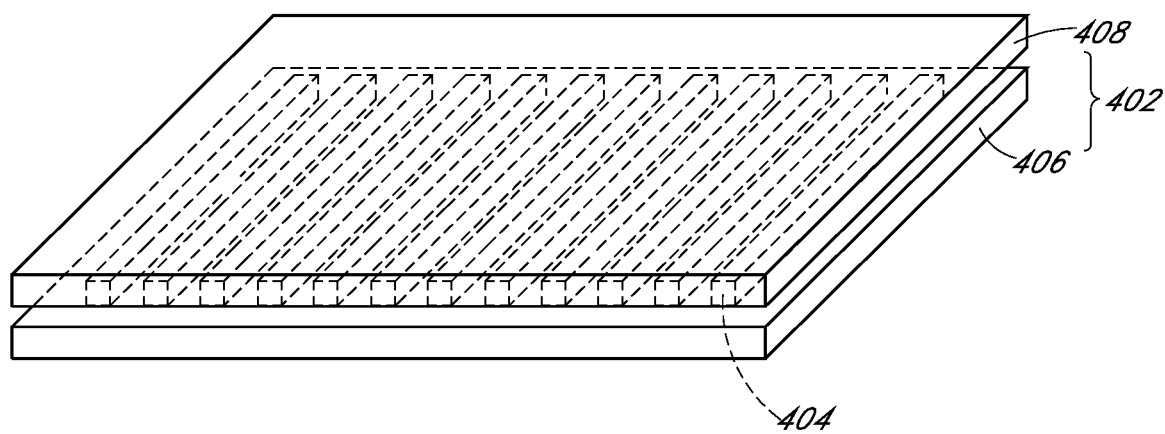
FIGS. 4A and 4B illustrate angled views of various stages of continued processing in the fabrication of a solar cell using foil-based metallization, in accordance with an embodiment of the present disclosure.

Referring FIG. 4A, starting from FIG. 2C, a laser trimmed metal foil 408 coupled to wafer 402 is provided. The wafer 402 has a plurality of emitter regions 404 (which may include metal seed regions) disposed on or above a substrate 406.

In an embodiment, the metallized surface of the wafer 402 includes alternating N-type and P-type semiconductor regions and a plurality of metal seed material regions on each of the alternating N-type and P-type semiconductor regions, as is described in greater detail below in association with FIGS. 5A-5C. In an embodiment, the metal foil sheet 408 is an aluminum (Al) foil having a thickness approximately in the range of 5-100 microns. In one embodiment, the Al foil is an aluminum alloy foil including aluminum and second element such as, but not limited to, copper, manganese, silicon, magnesium, zinc, tin, lithium, or combinations thereof. In one embodiment, the Al foil is a temper grade foil such as, but not limited to, F-grade (as fabricated), O-grade (full soft), H-grade (strain hardened) or T-grade (heat treated). In one embodiment, the aluminum foil is an anodized aluminum foil.

Figure 4B:
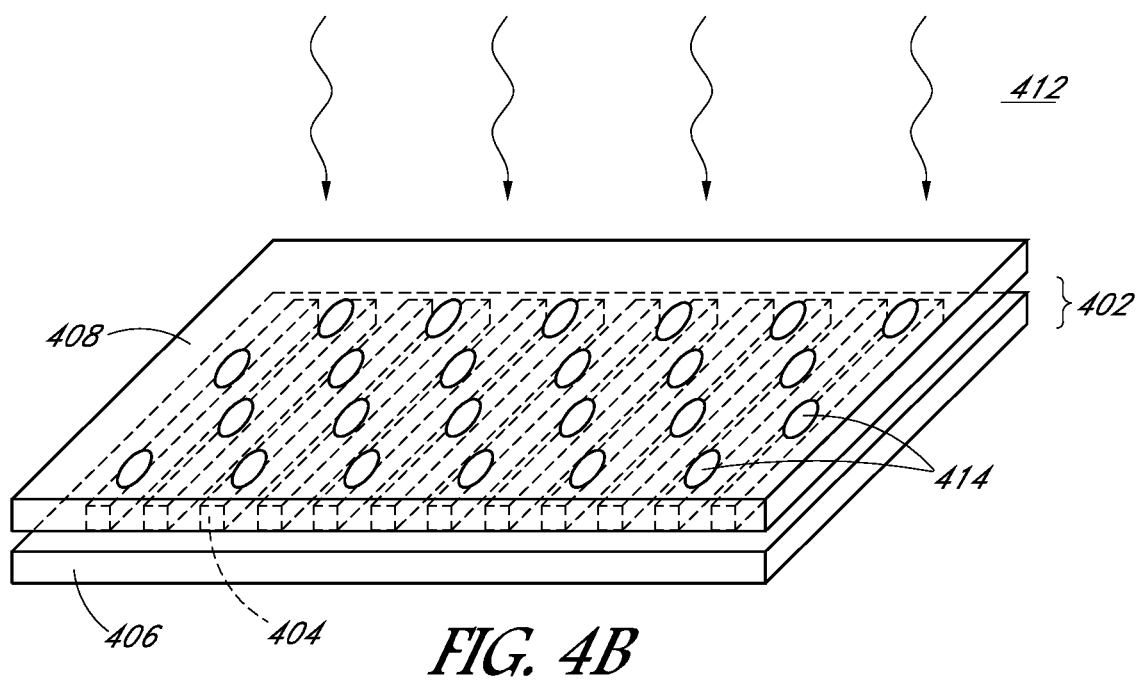

Referring to FIG. 4B, the method further involves, subsequent to trimming the metal foil 408, electrically contacting the metal foil 408 to the metalized surface of the wafer 402. In an embodiment, laser irradiation 412 is applied to form laser weld spots 414 between the metal foil 408 and the plurality of emitter regions 404.

It is to be appreciated that coupling of a metal foil with underlying emitter regions of a solar cell (or metal seed regions on the emitter regions) need not require direct coupling of all contact points of the metal foil and the solar cell. Referring again to FIG. 4B, laser welding is performed in only certain locations in order to generate weld spots 414 adhering (by an electrical connection) the foil 408 to the plurality of emitter regions 404. It is also to be appreciated that, in another embodiment, the electrically contacting the metal foil 408 to the metalized surface of the wafer 402 (e.g., by laser spot welding) is performed prior to trimming the metal foil.

In an embodiment, the resulting structures of FIG. 4B is subjected to a contact metallization patterning process. As an example, FIGS. 5A-5C illustrate cross-sectional views of various stages of further continued processing in the fabrication of a solar cell using foil-based metallization, in accordance with an embodiment of the present disclosure.

Referring to FIG. 5A, a plurality of alternating N-type and P-type semiconductor regions are disposed above a substrate. In particular, a substrate 500 has disposed there above N-type semiconductor regions 504 and P-type semiconductor regions 506 disposed on a thin dielectric material 502 as an intervening material between the N-type semiconductor regions 504 or P-type semiconductor regions 506, respectively, and the substrate 500. The substrate 500 has a light-receiving surface 501 opposite a back surface above which the N-type semiconductor regions 504 and P-type semiconductor regions 506 are formed.

In an embodiment, the substrate 500 is a monocrystalline silicon substrate, such as a bulk single crystalline N-type doped silicon substrate. It is to be appreciated, however, that substrate 500 may be a layer, such as a multi-crystalline silicon layer, disposed on a global solar cell substrate. In an embodiment, the thin dielectric layer 502 is a tunneling silicon oxide layer having a thickness of approximately 2 nanometers or less. In one such embodiment, the term "tunneling dielectric layer" refers to a very thin dielectric layer, through which electrical conduction can be achieved. The conduction may be due to quantum tunneling and/or the presence of small regions of direct physical connection through thin spots in the dielectric layer. In one embodiment, the tunneling dielectric layer is or includes a thin silicon oxide layer.

In an embodiment, the alternating N-type and P-type semiconductor regions 504 and 506, respectively, are formed from polycrystalline silicon formed by, e.g., using a plasma-enhanced chemical vapor deposition (PECVD) process. In one such embodiment, the N-type polycrystalline silicon emitter regions 504 are doped with an N-type impurity, such as phosphorus. The P-type polycrystalline silicon emitter regions 506 are doped with a P-type impurity, such as boron. As is depicted in FIG. 5A, the alternating N-type and P-type semiconductor regions 504 and 506 may have trenches 508 formed there between, the trenches 508 extending partially into the substrate 500. Additionally, in one embodiment, a bottom anti-reflective coating (BARC) material 510 or other protective layer (such as a layer amorphous silicon) is formed on the alternating N-type and P-type semiconductor regions 504 and 506, as is depicted in FIG. 5A.

In an embodiment, the light receiving surface 501 is a texturized light-receiving surface, as is depicted in FIG. 5A. In one embodiment, a hydroxide-based wet etchant is employed to texturize the light receiving surface 501 of the substrate 500 and, possibly, the trench 508 surfaces as is also depicted in FIG. 5A. It is to be appreciated that the timing of the texturizing of the light receiving surface may vary. For example, the texturizing may be performed before or after the formation of the thin dielectric layer 502. In an embodiment, a texturized surface may be one which has a regular or an irregular shaped surface for scattering incoming light, decreasing the amount of light reflected off of the light receiving surface 501 of the solar cell. Referring again to FIG. 5A, additional embodiments can include formation of a passivation and/or anti-reflective coating (ARC) layers (shown collectively as layer 512) on the light-receiving surface 501. It is to be appreciated that the timing of the formation of passivation and/or ARC layers may also vary.

Referring again to FIG. 5A, a plurality of metal seed material regions 514 is formed to provide a metal seed material region on each of the alternating N-type and P-type semiconductor regions 504 and 506, respectively. The metal seed material regions 514 make direct contact to the alternating N-type and P-type semiconductor regions 504 and 506. In an embodiment, the metal seed regions 514 are aluminum regions. In one such embodiment, the aluminum regions each have a thickness approximately in the range of 0.3 to 20 microns and include aluminum in an amount greater than approximately 97% and silicon in an amount approximately in the range of 0-2%. In other embodiments, the metal seed regions 514 include a metal such as, but not limited to, nickel, silver, cobalt or tungsten. Optionally, a protection layer may be included on the plurality of metal seed material regions 514. In a particular embodiment, an insulating layer 516 is formed on the plurality of metal seed material regions 514. In an embodiment, the insulating layer 516 is a silicon nitride or silicon oxynitride material layer. In another embodiment, in place of the metal seed regions 514, a blanket metal seed layer is used that is not patterned at this stage of processing. In that embodiment, the blanket metal seed layer may be patterned in a subsequent etching process, such as a hydroxide-based wet etching process.

Referring again to FIG. 5A, a metal foil 518 is adhered to the alternating N-type and P-type semiconductor regions by directly coupling portions of the metal foil 518 with a corresponding portion of each of the metal seed material regions 514. In one such embodiment, the direct coupling of portions of the metal foil 518 with a corresponding portion of each of the metal seed material regions 514 involves forming a metal weld 520 at each of such locations, as is depicted in FIG. 5A.

In an embodiment, the metal foil 518 is an aluminum (Al) foil having a thickness approximately in the range of 5-100 microns. In one embodiment, the Al foil is an aluminum alloy foil including aluminum and second element such as, but not limited to, copper, manganese, silicon, magnesium, zinc, tin, lithium, or combinations thereof. In one embodiment, the Al foil is a temper grade foil such as, but not limited to, F-grade (as fabricated), O-grade (full soft), H-grade (strain hardened) or T-grade (heat treated). In one embodiment, the aluminum foil is an anodized aluminum foil. In an embodiment, the metal foil 518 is adhered directly to the plurality of metal seed material regions 514 by using a technique such as, but not limited to, a laser welding process as described in association with FIG. 4B. In an embodiment, the optional insulating layer 516 is included, and adhering the metal foil 518 to the plurality of metal seed material regions 514 involves breaking through regions of the insulating layer 516, as is depicted in FIG. 5A.

It is to be appreciated that, in accordance with another embodiment of the present disclosure, a seedless approach may be implemented. In such an approach, metal seed material regions 514 are not formed, and the metal foil 518 is adhered directly to the material of the alternating N-type and P-type semiconductor regions 504 and 506. For example, in one embodiment, the metal foil 518 is adhered directly to alternating N-type and P-type polycrystalline silicon regions. In either case, process may be described as adhering the metal foil to a metallized surface of a solar cell.

FIG. 5B illustrates the structure of FIG. 5A following formation of laser grooves in the metal foil. Referring to FIG. 5B, the metal foil 518 is laser ablated through only a portion of the metal foil 518 at regions corresponding to locations between the alternating N-type and P-type semiconductor regions 504 and 506, e.g., above trench 508 locations as is depicted in FIG. 5B. The laser ablating forms grooves 530 that extend partially into, but not entirely through, the metal foil 518. In an embodiment, forming laser grooves 530 involves laser ablating a thickness of the metal foil 518 approximately in the range of 80-99% of an entire thickness of the metal foil 518. That is, in one embodiment, it is critical that the lower portion of the metal foil 518 is not penetrated, such that metal foil 518 protects the underlying emitter structures.

Figure 5C:
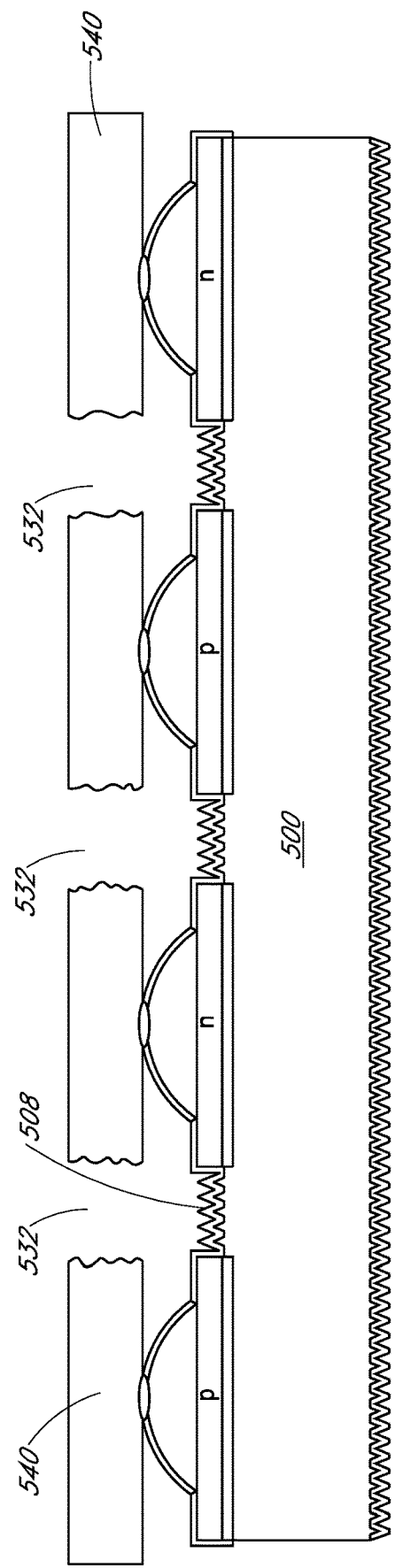

The grooves 530 of FIG. 5B may then be used to isolate conductive regions 540 as metallization structures for the underlying emitter regions. For example, referring to FIG. 5C, the grooves 530 are extended to provide gaps 532 between conductive regions 540. In an embodiment, the patterned metal foil 518 is etched to isolate portions 540 of the metal foil 518. In one such embodiment, the structure of FIG. 5B is exposed to a wet etchant. Although the wet etchant etches all exposed portions of the metal foil 518, a carefully timed etch process is used to break through the bottoms of the laser grooves 530 without significantly reducing the thickness of the non-grooved regions 540 of the metal foil 518, as is depicted in FIG. 5C. In a particular embodiment, a hydroxide based etchant is used, such as, but not limited to, sodium hydroxide (NaOH), potassium hydroxide (KOH) or tetramethylammonium hydroxide (TMAH).

In another embodiment (not shown), the remaining metal foil 518 of FIG. 5B is subsequently anodized at exposed surfaces thereof to isolate regions 540 of the remaining metal foil 518 corresponding to the alternating N-type and P-type semiconductor regions 504 and 506. In particular, the exposed surfaces of the metal foil 518, including the surfaces of the grooves 530, are anodized to form an oxide coating. At locations corresponding to the alternating N-type and P-type semiconductor regions 504 and 506, e.g., in the grooves 530 at locations above the trenches 508, the entire remaining thickness of the metal foil 518 is anodized there through to isolate regions 540 of metal foil 518 remaining above each of the N-type and P-type semiconductor regions 504 and 506.

Although certain materials are described specifically with reference to above described embodiments, some materials may be readily substituted with others with other such embodiments remaining within the spirit and scope of embodiments of the present disclosure. For example, in an embodiment, a different material substrate, such as a group III-V material substrate, can be used instead of a silicon substrate. Additionally, although reference is made significantly to back contact solar cell arrangements, it is to be appreciated that approaches described herein may have application to front contact solar cells as well. In other embodiments, the above described approaches can be applicable to manufacturing of other than solar cells. For example, manufacturing of light emitting diode (LEDs) may benefit from approaches described herein.

Thus, laser foil trim approaches for foil-based metallization of solar cells, and the resulting solar cells, have been disclosed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method of fabricating a solar cell, the method comprising:
    attaching a metal foil sheet to a surface of a wafer to provide a unified pairing of the metal foil sheet and the wafer, wherein the wafer has a perimeter, a metal foil sheet side opposite a wafer side, and a portion of the metal foil sheet overhanging the perimeter; and
    laser scribing the metal foil sheet from the metal foil sheet side and along the perimeter of the wafer, the laser scribing comprising removing the portion of the metal foil sheet overhanging the perimeter to provide a metal foil piece coupled to the surface of the wafer, wherein the laser scribing overlaps the wafer inside the perimeter of the wafer and is outside an outermost emitter region of the wafer.

2. The method of claim 1, wherein attaching the metal foil sheet to the surface of the wafer comprises using a technique selected from the group consisting of a laser welding process, a thermocompression process and an ultrasonic bonding process.

3. The method of claim 1, wherein the laser scribing comprises using a laser beam having a width approximately in the range of 300-600 microns.

4. The method of claim 1, wherein the laser scribing comprises using a laser beam having a central axis aligned to the perimeter of the wafer.

5. The method of claim 1, wherein the laser scribing comprises using a galvanometer alignment system to align a laser beam to the perimeter of the wafer.

6. The method of claim 1, wherein the laser scribing comprises using a continuous laser beam process.

7. The method of claim 1, wherein the laser scribing comprises using a pulsed laser beam process.

8. A method of fabricating a solar cell, the method comprising:
    attaching a metal foil sheet to a surface of a wafer to provide a unified pairing of the metal foil sheet and the wafer, wherein the wafer has a perimeter, a metal foil sheet side opposite a wafer side, and a portion of the metal foil sheet overhanging the perimeter; and
    laser scribing the metal foil sheet from the metal foil sheet side and along the perimeter of the wafer, the laser scribing comprising removing the portion of the metal foil sheet overhanging the perimeter to provide a metal foil piece coupled to the surface of the wafer, the laser scribing further comprising welding a portion of the metal foil sheet to the wafer inside the perimeter of the wafer and is outside an outermost emitter region of the wafer, wherein the laser scribing overlaps the wafer inside the perimeter of the wafer and is outside an outermost emitter region of the wafer.

9. The method of claim 8, wherein welding the portion of the metal foil sheet to the wafer comprises using the wafer as a heat sink during the laser scribing.

10. The method of claim 8, wherein attaching the metal foil sheet to the surface of the wafer comprises using a technique selected from the group consisting of a laser welding process, a thermocompression process and an ultrasonic bonding process.

11. The method of claim 8, wherein the laser scribing comprises using a laser beam having a width approximately in the range of 300-600 microns.

12. The method of claim 8, wherein the laser scribing comprises using a laser beam having a central axis aligned to the perimeter of the wafer.

13. The method of claim 8, wherein the laser scribing comprises using a galvanometer alignment system to align a laser beam to the perimeter of the wafer.

14. The method of claim 8, wherein the laser scribing comprises using a continuous laser beam process or a pulsed laser beam process.

15. A method of fabricating a solar cell, the method comprising:
    attaching a metal foil sheet to a surface of a wafer to provide a unified pairing of the metal foil sheet and the wafer, wherein the wafer has a perimeter, a metal foil sheet side opposite a wafer side, and a portion of the metal foil sheet overhanging the perimeter; and
    laser scribing the metal foil sheet from the metal foil sheet side using a first laser beam, laser scribing the metal foil sheet from the wafer side using a second laser beam and along the perimeter of the wafer, the laser scribing comprising removing the portion of the metal foil sheet overhanging the perimeter to provide a metal foil piece coupled to the surface of the wafer, wherein the laser scribing overlaps the wafer inside the perimeter of the wafer and outside an outermost emitter region of the wafer.

16. The method of claim 15, wherein attaching the metal foil sheet to the surface of the wafer comprises using a technique selected from the group consisting of a laser welding process, a thermocompression process and an ultrasonic bonding process.

17. The method of claim 15, wherein the laser scribing comprises using a first laser beam and a second laser beam having a width approximately in the range of 300-600 microns.

18. The method of claim 15, wherein the laser scribing comprises using a first laser beam and a second laser beam having a central axis aligned to the perimeter of the wafer.

19. The method of claim 15, wherein the laser scribing comprises using a galvanometer alignment system to align the central axis of the first laser beam and the second laser beam to the perimeter of the wafer.

20. The method of claim 15, wherein the laser scribing comprises using a continuous laser beam process or a pulsed laser beam process.

* * * * *